United States Patent
Shaikevitch et al.

(10) Patent No.: US 8,597,988 B2
(45) Date of Patent: Dec. 3, 2013

(54) SYSTEM FOR FLASH-FREE OVERMOLDING OF LED ARRAY SUBSTRATES

(75) Inventors: Alexander Shaikevitch, Livermore, CA (US); Vahid Moshtagh, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 293 days.

(21) Appl. No.: 12/977,596

(22) Filed: Dec. 23, 2010

(65) Prior Publication Data

US 2012/0126281 A1 May 24, 2012

Related U.S. Application Data

(60) Provisional application No. 61/415,333, filed on Nov. 18, 2010.

(51) Int. Cl.
*H01L 23/28* (2006.01)

(52) U.S. Cl.
USPC 438/127; 257/88; 257/E21.502; 257/E21.506; 257/E23.056; 257/E23.065; 438/15; 438/28; 438/112

(58) Field of Classification Search
USPC ............ 257/E21.502, E21.506, 88, E23.056, 257/E23.065; 438/15, 28, 127, 112
See application file for complete search history.

(56) References Cited

U.S. PATENT DOCUMENTS

| | | | | |
|---|---|---|---|---|
| 7,478,925 | B2 * | 1/2009 | Hiyama et al. | 362/249.02 |
| 8,212,271 | B2 * | 7/2012 | Kotani et al. | 257/98 |
| 2010/0181582 | A1 * | 7/2010 | Li et al. | 257/91 |

* cited by examiner

*Primary Examiner* — John C Ingham
(74) *Attorney, Agent, or Firm* — Arent Fox LLP

(57) ABSTRACT

System for flash-free overmolding of LED array substrates. In an aspect, a method is provided for molding encapsulations onto an LED array substrate. The method includes attaching a protective tape onto a substrate surface of the substrate so that openings in the protective tape align with LED devices of the substrate and applying molding material onto a molding surface of a molding tool and to portions of the substrate exposed through the openings in the protective tape. The method also includes pressing the molding surface and the substrate surface together at a selected pressure and a selected temperature so that encapsulations are formed on the portions of the substrate exposed through the openings in the protective tape, separating the molding surface from the substrate surface, and removing the protective tape so that molding material flash is removed from the substrate leaving a clean molded substrate.

28 Claims, 6 Drawing Sheets

SYSTEM FOR FLASH-FREE OVERMOLDING OF LED ARRAY SUBSTRATES

CROSS-REFERENCE TO RELATED APPLICATIONS

This application claims the benefit of U.S. Provisional Patent application Ser. No. 61/415,333 entitled "SEAMLESS AND FLASH FREE METHOD OF SILICON OVERMOLDING" which was filed on Nov. 18, 2010. The entirety of the aforementioned application is herein incorporated by reference.

FIELD

The present application relates generally to light emitting diodes, and more particularly, to a system for flash-free overmolding of LED array substrates.

BACKGROUND

A light emitting diode comprises a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to as an n-type or p-type semiconductor region, respectively.

In LED applications, an LED semiconductor chip includes an n-type semiconductor region and a p-type semiconductor region. A reverse electric field is created at the junction between the two regions, which causes the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light. The ability of LED semiconductors to emit light has allowed these semiconductors to be used in a variety of lighting devices. For example, LED semiconductors may be used in general lighting devices for interior applications or in various exterior applications.

During manufacture, an array comprising a large number of LED semiconductor devices (or dies) are produced on a substrate. A molding process is used to mold encapsulations having a desired shape over each device. For example, the encapsulations may be lenses that comprise phosphor, silicone or other materials that are molded into a variety of shapes designed to extract light emitted from the LED devices.

There are several methods that can be use to create encapsulations from plastics or other materials. These methods include thermoforming, compression molding, transfer molding and injection molding. The first two are the simplest and oldest methods; the first one however is applicable only to thermoplastic materials which can be thermoformed using pressure and heat. The second one, namely compression molding, is widely used in the plastics industry as it is applicable to both thermoplastics and thermosets.

It is a well known trend that manufacturers try to avoid the compression molding technique due to its batch oriented nature and the necessity to clean off seams and flash from the molded product. For example cleaning the flash is largely a manual operation and is especially tedious, time consuming, and inefficient. Furthermore, cleaning the flash is even more difficult when the substrate is designed from flexible material and/or includes perforations, grooves, or gaps that are designed to facilitate separation of the devices from the substrate.

Accordingly, what is needed is a simple and efficient system to overmold encapsulations onto LED array substrates that reduces the time and manual operations necessary to clean seams and flash resulting from the molding process. The system should also work with flexible substrates having perforations, grooves or other features that typically make cleaning difficult and time consuming.

SUMMARY

In one or more aspects, a substrate overmolding system is provided for molding encapsulations onto LED array substrates. For example, the encapsulations may comprise lenses or LED die covers molded from phosphor, silicone or other materials. The system provides a simple, inexpensive, and conveyer-oriented process for encapsulation overmolding that can be used to mold complex shapes on substrates comprising a large array of LED dies. The system is also suitable for use with flexible substrates having perforations, grooves or other features that typically make cleaning difficult and time consuming.

In various embodiments, the overmolding system utilizes a protective tape that is applied to the substrate prior to molding. The protective tape protects areas of the substrate (such as electrical contact regions) from exposure to the molding material. The protective tape also provides for flash removal after the molding process is complete. Thus, the after-mold labor is reduced just to stripping off the protective tape which takes only seconds. The resulting molded substrate is then essentially clean with no flash, seams or bubbles.

In an aspect, a method is provided for molding encapsulations onto an LED array substrate. The method comprises attaching a protective tape onto a substrate surface of the substrate so that openings in the protective tape align with LED devices of the substrate, and applying molding material onto a molding surface of a molding tool and to portions of the substrate exposed through the openings in the protective tape. The method also comprises pressing the molding surface and the substrate surface together at a selected pressure and a selected temperature so that encapsulations are formed on the portions of the substrate exposed through the openings in the protective tape. The method also comprises separating the molding surface from the substrate surface and removing the protective tape so that molding material flash is removed from the substrate leaving a clean molded substrate.

In an aspect, an apparatus is provided for molding encapsulations onto an LED array substrate. The apparatus comprises means for attaching a protective tape onto a substrate surface of the substrate so that openings in the protective tape align with LED devices of the substrate and means for applying molding material onto a molding surface of a molding tool and to portions of the substrate exposed through the openings in the protective tape. The apparatus also comprises means for pressing the molding surface and the substrate surface together at a selected pressure and a selected temperature so that encapsulations are formed on the portions of the substrate exposed through the openings in the protective tape, means for separating the molding surface from the substrate surface, and means for removing the protective tape so that molding material flash is removed from the substrate leaving a clean molded substrate.

In an aspect, a method is provided for attaching protective tape to an LED array substrate. The method comprises exposing an adhesive surface of a portion of a protective tape that comprises a plurality of portions and securing a backside surface of the portion of the protective tape to a mounting surface so as to eliminate air pockets between the portion of the protective tape and the mounting surface. The method also comprises pressing a substrate surface onto the adhesive surface of the portion of the protective tape so that openings in the portion of the protective tape align with LED devices of the substrate and so that the protective tape is attached to the substrate. The method also comprises repeating the operations of exposing, securing, and pressing until all the portions of the protective tape have been attached to substrates.

Other aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

Figure 1:
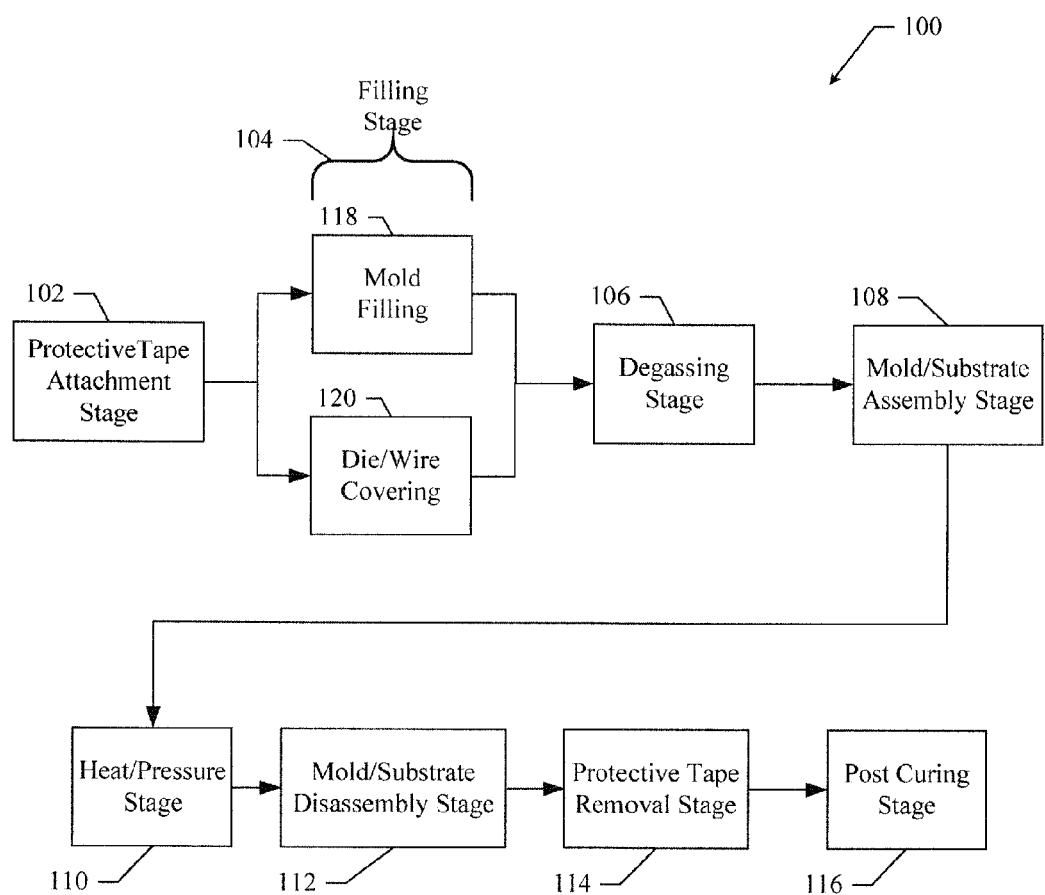
FIG. 1 shows an exemplary overmolding system for molding encapsulations onto LED array substrates.

In various aspects, an overmolding system is provided for molding encapsulations onto LED array substrates.

The present invention is described more fully hereinafter with reference to the accompanying Drawings, in which various aspects of the present invention are shown. This invention may, however, be embodied in many different forms and should not be construed as limited to the various aspects presented throughout this disclosure. Rather, these aspects are provided so that this disclosure will be complete enough to provide a thorough understanding of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes may not be intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the Drawings. By way of example, if an apparatus in the Drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention FIG. 1 shows an exemplary overmolding system 100 for molding encapsulations onto LED array substrates. In an exemplary implementation, the system 100 comprises a protective tape attachment stage 102, filling stage 104, degassing stage 106, mold/substrate assembly stage 108, heat/pressure stage 110, mold/substrate disassembly stage 112, protective tape removal stage 114, and post curing stage 116. The filling stage 104 comprises mold filling 118 to fill a molding tool with molding material, and die/wire covering 120 to cover dies and wires of the substrate with molding material.

Each stage of the system 100 may operate independently and the stages may be linked together so that the output (or result) of one stage is automatically input to the next stage. For example, a conveyer or other mechanism may be used to transport an LED array substrate from one stage to the next as the processes at each stage are completed. Thus, the system 100 may operate to overmold substrates in a semi- or fully automated process. The following describes various aspects of each stage of the overmolding system 100.

Tape Attachment Stage

The protective tape attachment stage 102 comprises apparatus configured to attach a protective tape onto an LED array substrate. For example, in one implementation, the protective tape comprises polyimide based or Teflon based tape having an adhesive surface that is attached to the array substrate. The protective tape performs two functions. First, the tape protects (or masks) electrical contact regions and other regions of the substrate from exposure to the molding material. Second, the tape collects molding flash for quick removal. The processes performed at the protective tape attachment stage 102 are designed to make tape attachment a semi-automatic and continuous process manageable by one operator as described below.

Figure 2:
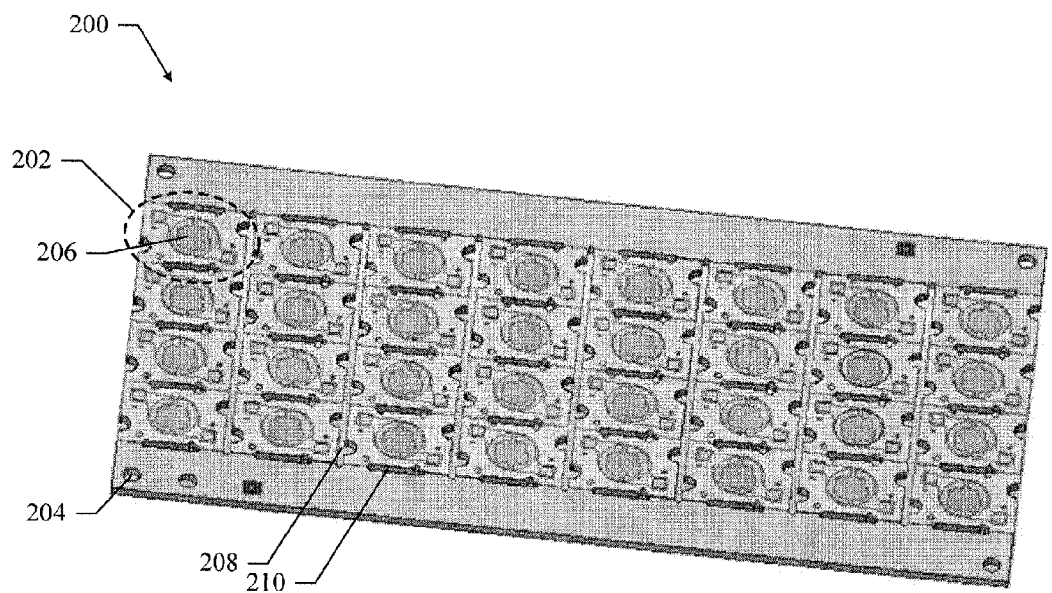
FIG. 2 shows an exemplary LED array substrate.

FIG. 2 shows an exemplary LED array substrate 200. The substrate 200 comprises an array of LED semiconductor devices, illustrated at 202. In this example, the substrate 200 comprises 32 LED semiconductor devices. In addition, each semiconductor device 202 comprises wires, electrical connections or other device components that are to be covered by an encapsulation.

The substrate 200 also comprises alignment holes 204, which help to align the substrate with protective tape as described below. Each semiconductor device 202 has a light emitting region 206 that emits light when the device is energized. In various implementations, the substrate 200 is designed to be either rigid or flexible. The substrate 200 may also comprises perforations or holes (indicated at 208) and grooves (indicated at 210) which are provided to facilitate removal of the devices from the substrate 200. It should be noted that the substrate 200 is just one example, and that the system is suitable for use with both rigid and flexible substrates and substrates having perforations, holes, gaps, grooves or other surface details.

The system 100 is operable to mold encapsulations over the light emitting regions 206 (including dies, wires, etc.) of the semiconductor devices 202. For example, the encapsulations may be lenses that operate to control the intensity and color of light that each device emits. The system 100 uses a protective tape to cover electrical contact regions of the substrate 200 from exposure to the molding material. The protective tape also provides for quick and easy cleanup of molding flash. The protective tape is suitable for use with rigid or flexible substrates and is especially well suited to mask the perforations 208 and grooves 210 from the molding material, which also facilitates easy cleanup.

Figure 3:
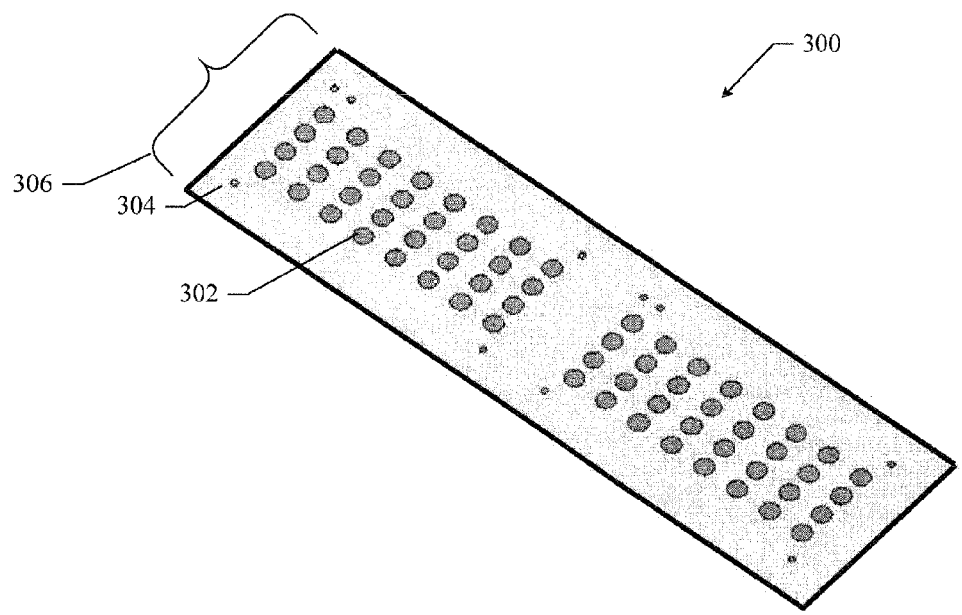
FIG. 3 shows an exemplary protective tape to be applied to the substrate of FIG. 2.

FIG. 3 shows an exemplary protective tape 300 for use in the overmolding system 100. For example, the protective tape 300 is applied to the substrate 200 prior to the molding process. In one implementation, the protective tape comprises polyimide based tape or Teflon™ based tape having an adhesive surface comprised of a silicone adhesive that is covered with a protective film liner. For example, polyimide based tape is capable of withstanding high temperatures and pressures without damage.

The protective tape 300 is punched or otherwise manufactured with openings 302 at locations that correspond to the locations of the light emitting regions 206 of the semiconductor devices 202 of the substrate 200. In one implementation, the adhesive surface of the protective tape is attached onto the top surface of the substrate 200 and is aligned to mask everything but the light emitting regions 206. For example, the openings 302 in the protective tape are aligned with the semiconductor devices of the substrate 200 and represent the locations where the encapsulations are to be located.

The width 306 of the protective tape is designed to be approximately one fourth to one half of an inch larger than the width of the substrate 200. This additional width provides a spill over region that captures flash from the molding process. It should be noted that other widths are possible to increase or decrease the spill-over region. The protective 300 tape is also punched with positioning holes 304 in a pattern identical to the alignment holes 204 of the substrate 200 to allow dowel pins or other alignment mechanism to align the protective tape 300 with the substrate 200 when the tape is attached.

Figure 4:
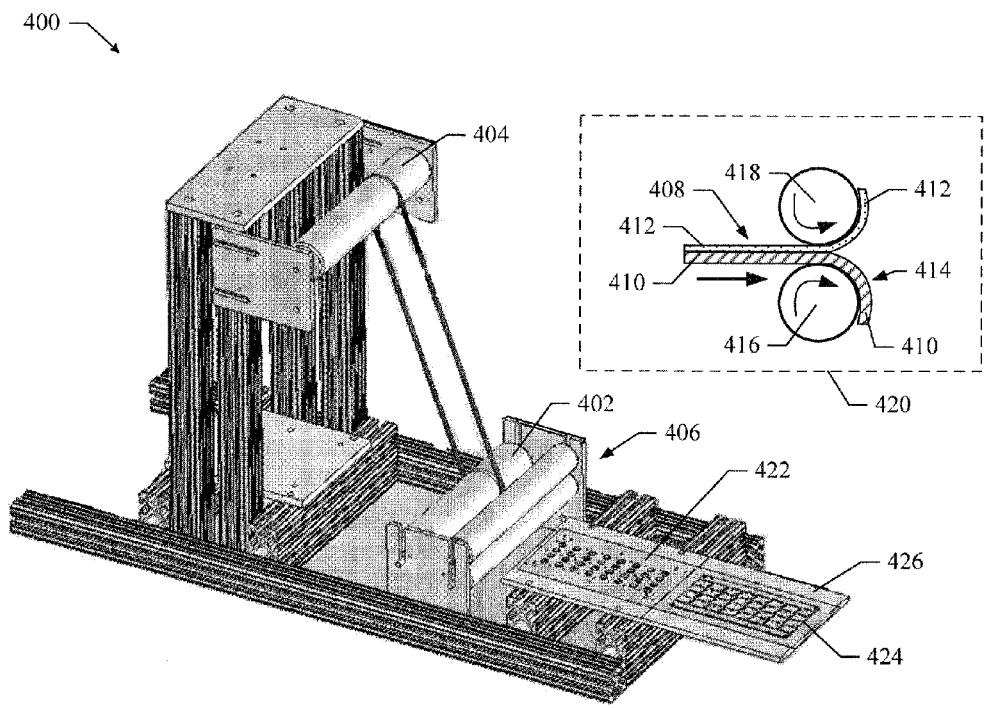
FIG. 4 shows an exemplary masking tool that is designed to attach protective tape onto the substrate of FIG. 2.

FIG. 4 shows an exemplary masking tool 400 that is designed to attach the punched protective tape 300 onto the substrate 200. The masking tool 400 has two main rollers (402, 404) that roll together by means of a belt. The lower roller 402 operates to hold a roll of protective tape and the upper roller 404 operates to collect a film liner that is removed from the protective tape to expose an adhesive surface that is to be applied to the substrate 200. Smaller rollers, shown at 406, are used to manipulate the protective tape into position and remove the film liner to allow the protective tape to be applied onto the substrate 200.

A detailed view shown at 420 illustrates the operation of the small rollers 406 (comprising rollers 418 and 416) to remove the film liner to expose the adhesive surface of the protective tape. For example, a portion of protective tape 408, comprising a tape portion 410 and a film liner 412, passes between the two small rollers 418 and 416. The film liner 412 passes around the roller 418 which directs the film liner upwards to be collected on the upper roller 404. The tape portion 410 moves around the small roller 416 and is directed downward to be applied to a substrate.

Once the film liner 412 is removed, the adhesive surface 414 is exposed. The tape portion 410 is then aligned (adhesive side up) on a vacuum chuck 426. The vacuum chuck 426 holds the tape portion 410 in place while a substrate (semiconductor dies facing down) is pressed onto the adhesive surface 414. For example, the tape portion shown at 422 represents the tape portion (with adhesive surface 414 facing up) that is secured by the vacuum chuck 426. The tape portion shown at 424 is shown after a substrate is pressed down onto the adhesive surface. Thus, a roll of protective tape comprises many portions and each portion is designed to be attached to a substrate. The masking tool 400 operates to dispense and secure the protective tape while an LED array substrate is aligned and attached to each tape portion. This process is performed in a continuous fashion to provide an automated or semi-automated process to dispense all the portions of the protective tape and attach each portion to a substrate.

Figure 5:
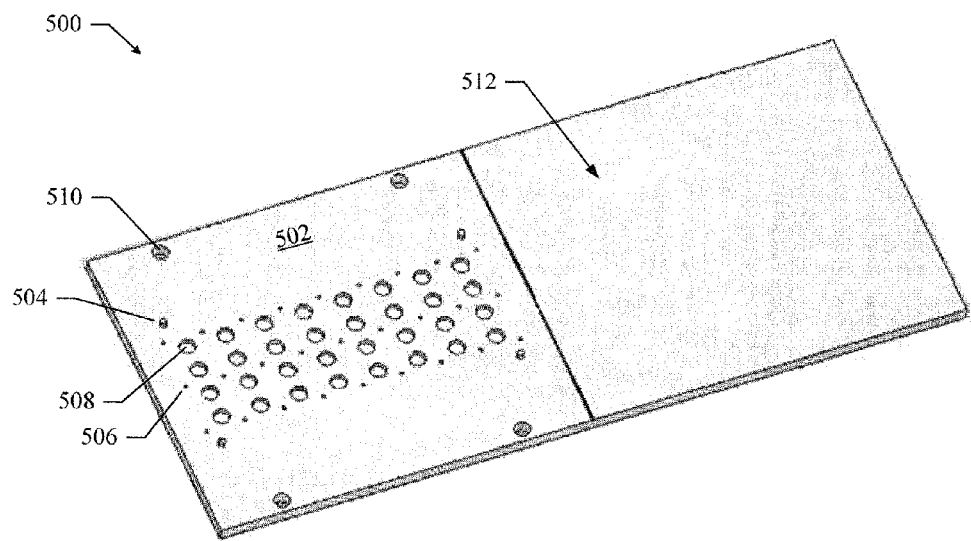
FIG. 5 shows an exemplary vacuum chuck for use with the masking tool of FIG. 4 to secure protective tape prior to attachment to a substrate.

FIG. 5 shows an exemplary vacuum chuck 500. For example, the vacuum chuck 500 is suitable for use as the vacuum chuck 426 shown in FIG. 4. The vacuum chuck 500 operates to secure a portion of the protective tape with its adhesive surface facing up. The tape is pulled through the rollers 406 and placed over a vacuum surface 502 adhesive side up with the protective tape positioning holes 304 positioned onto vacuum chuck dowel pins 504. As a vacuum is turned on, small holes 506 in the vacuum surface 502 pull the protective tape firmly flat with no wrinkles so that there are no air pockets between the vacuum surface 502 and the backside surface of the protective tape. A substrate is then pressed face down on the protective tape and positioned by dowel pins 504 of the vacuum chuck. A rubber or metal roller can be used to press the substrate against the adhesive surface of the tape to secure good adhesion and no air pockets. There are round cavities 508 in vacuum chuck surface 502 to allow for clearance for the semiconductor dies and wire bonds on the substrate. Mounting holes 510 are also provided to mount the vacuum chuck 500 onto the masking tool 400.

The protective tape with the LED array substrate attached to it is then removed from dowel pins 504 of the vacuum chuck 500 and is pulled forward towards the flat side 512 of vacuum chuck 500. When pulled forward to the surface 512, another portion of the protective tape flows through the rollers 406 where the tape liner is separated from the tape exposing the adhesive surface.

The next portion of protective tape with punched openings 302 is then positioned adhesive side up on dowel pins 504 of vacuum chuck 500 and the process is repeated for many portions of the protective tape until a sufficient number of substrates are covered with the protective tape.

Filling Stage

The filling stage 104 comprises mold filling 118 to fill a molding tool with molding material and die/wire covering 120 to cover dies and wires on the substrate with the same molding material.

Mold Filling

Figure 6:
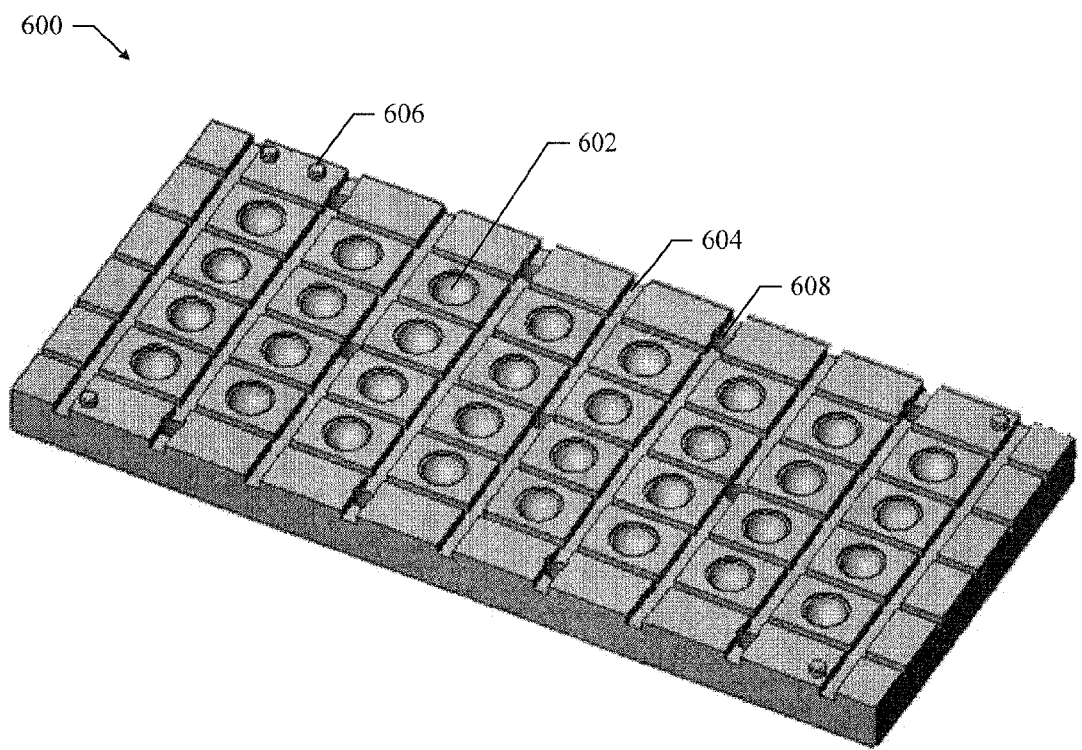
FIG. 6 shows an exemplary molding tool.

FIG. 6 shows an exemplary molding tool 600. In one implementation, the molding tool 600 comprises stainless steel material having a molding surface that comprises highly polished cavities 602 that are formed with the desired shape of the encapsulations to be molded. The molding surface also comprises canals 604 between the cavities 602 to facilitate the escape of excess molding material. Guide pins 606 are also provided to help align the molding tool 600 with a substrate during the molding process.

In one implementation, prior to mold filling, the entire surface of the molding tool is covered with a very thin (100-1000 nm) silicone release agent to facilitate the release of the molding tool 600 from the molding material after the molding process is completed. For example, the molding tool 600 is dipped into the release agent and any excess is removed. A curing process is performed to solidify the release agent and form a very thin, even and consistent coating of the release agent onto the molding tool 600. In one implementation, the molding tool 600 also comprises holes 608 to accommodate ejection pins used to separate the molding tool 600 from the substrate after the molding process is complete.

During the molding process, the molding cavities 602 are filled with molding material comprising fluid silicone or a mixture of silicone with phosphor. In one implementation, an automatic dispenser is used to perform this operation. During the dispensing process, an excess of molding material in the cavities 602 may be desired and no practical restriction on the accuracy of the dispensing or the presence of an occasional bubble is necessary.

Covering Dies and Wires

To facilitate the molding process, the unmasked areas of the substrate are covered with the same fluid silicone or mixture of silicone with phosphor that is used to fill the molding tool 600. In this operation, the areas within the openings 302 of the protective tape that surround wire-bonded chips of the LED array are covered with the molding material. It is desirable to have the edges around the openings 302 of the protective tape covered with the fluid silicone/silicone phosphor mixture in order to preclude re-absorption of air in the degassing stage that follows when the vacuum of a vacuum oven is released and the substrate is exposed to atmospheric air pressure. Although a small droplet of silicone of a moderate viscosity is usually sufficient to cover the die region, an overflow where droplets collide or spilling onto the protective tape covering the substrate represents no danger for the process. In one implementation, an automatic dispenser is used to perform this operation.

Degassing Stage

In the degassing stage 106 the molding materials placed in the molding tool 600 and on the substrate are degassed. In one implementation, the molding tool 600 and substrate are degassed in a vacuum oven. For example, the molding fixture 600 and substrate are placed in the vacuum oven for approximately 6 to 15 minutes at a temperature of approximately 50 to 90 degrees Centigrade (C). This degassing process is sufficient for most commonly used silicones. No periodic vacuum release or overflow watch is required. If there are no excessive air bubbles contained in the mixture, the operation can be performed largely unsupervised.

Mold/Substrate Assembly Stage

In the mold/substrate assembly stage 108 the molding tool 600 and substrate are assembled. For example, the substrate is turned tape side down and aligned onto molding tool 600 using the guide pins 606. Thus, the molding surface is placed in contact with the substrate surface that is covered with the protective tape. The operation can be performed relatively quickly so that no spillage of silicone from the substrate occurs as the silicone is held to the substrate surface by surface tension. In one implementation, a robotic assembly device having suction cups or other gripping mechanism is used to grab the substrate, flip it, and place it on top of and in alignment with the molding tool 600.

Heat/Pressure Stage

In the heat and pressure stage 110, the assembled substrate and molding tool are placed into a press having platens heated to approximately 110 to 120 degrees C. The assembly remains in the press for several minutes depending on the nature of molding material. The force of the closed press is set to be sufficient to completely squeeze out the excess of silicone into the canals 604 of the molding tool 600 and/or onto the margins (or spillover regions) of the protective tape. In one implementation, this force varies from 500 to 4000 pounds (lbs) depending on the size of the substrate and the viscosity of the silicone/phosphor mixture. However, any suitable molding press set to any desired force may be used for this operation.

Mold/Substrate Disassembly Stage

In the mold/substrate disassembly stage 112, the assembled mold/substrate are removed from the press and allowed to cool for several minutes to allow for ease of handling. Once cooled, the substrate is pried off of the molding tool 600 so that the molding surface is separated from the substrate surface. For example, this may be accomplished in a manual operation using a utility blade or other tool to separate the molding tool 600 from the substrate. The separation of the substrate from the molding tool may also be performed in an automated process through the use of ejection pins that are pushed through holes 608 in the molding tool 600 to force apart the substrate from the molding tool 600. In one implementation, a robotic mold separator having suction cups or other gripping mechanism is used to separate the substrate from the molding tool 600.

Tape Removal Stage

In the tape removal stage 114, the protective tape is removed from the substrate. For example, once the substrate and the molding tool 600 are separated, the protective tape still covers the substrate and excess molding material may have spread onto the protective tape as a result of the heating and pressing processes. The protective tape is then removed by peeling it off of the substrate. Thus, all the excess of silicone which is stuck to the tape is removed as well. As a result, the surface of the molding fixture and the surface of the substrate remain essentially clean with no flash or seems whatsoever.

In one implementation, the removal of the protective tape is performed manually by peeling it off of the substrate and requires only a few seconds. However, in one implementation, a robotic tape removal device having a gripping mechanism is used to grip an edge of the protective tape and peel it from the substrate.

Post Curing Stage

In the post curing stage, the molded substrate is allowed to cure in accordance with the molding material's curing time requirements. For example, the molded substrate may be allowed to cure in conditions appropriate for the type of molding material. For example, one type of silicone molding material is allowed to cure at a temperature of 150 C for approximately 60 minutes.

Figure 7:
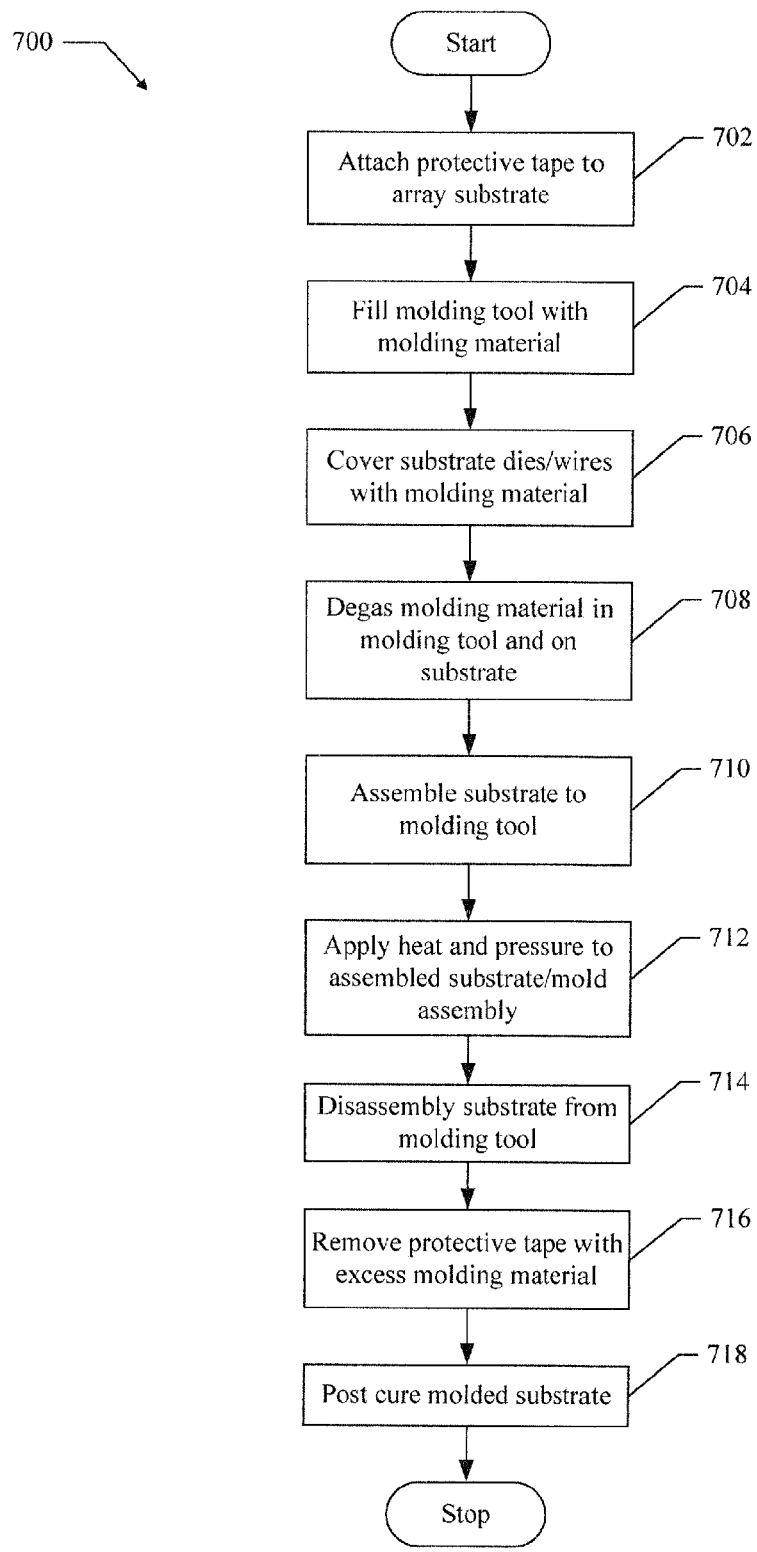
FIG. 7 shows an exemplary method for performing flash free overmolding of an LED array substrate.

FIG. 7 shows a method 700 for performing flash free overmolding of an LED array substrate. For example, the method 700 can be used to perform flash free overmolding of the substrate 200 described above.

At block 702, a protective tape is attached to an LED array substrate. For example, the protective tape may be polyimide based tape or Teflon™ based tape that is attached so that an adhesive surface of the tape is attached to a substrate surface so that openings 302 in the tape align with semiconductor devices of the substrate. In one implementation, the masking tool 400 operates as described above to attach the protective tape to the substrate. The protective tape also functions to mask selected regions of the substrate from exposure to molding material. For example, the selected regions may comprise regions on the substrate having electrical contacts.

At block 704, a molding tool is filled with molding material. For example, the cavities 602 of the molding tool 600 are filled with molding material comprising fluid silicone or a mixture of silicone with phosphor. In one implementation, the molding tool 600 is coated with a release agent prior to filling with the molding material. An automated dispenser is used to fill the molding tool with the molding material.

At block 706, dies and wires of the substrate that are exposed through the openings 302 in the protective tape are covered with molding material. For example, the dies and wires are covered with fluid silicone or a mixture of silicone with phosphor. In one implementation, an automated dispenser is used to cover the dies and wires with the molding material.

At block 708, the molding material in the molding tool and on the substrate is degassed. For example, after dispensing the molding material, the molding tool 600 and substrate 200 are placed in a heat oven for an amount of time sufficient to degas the molding material.

At block 710, the substrate and molding tool are assembled. For example, the substrate having a small amount of molding material covering the dies and wires exposed through the openings 302 of the protective tape is flipped over and placed on top of the molding tool so that the surface of the protective tape contacts the molding surface of the molding tool as described above. In one implementation, an automatic assembly device performs this operation.

At block 712, the assembled substrate/molding tool are pressed and heated. For example, the assembled molding tool and substrate are heated at a temperature of approximately 110 to 120 degrees and pressed together with a pressure of 500 lbs to 4000 lbs. In one implementation, a molding press having heated platens performs this operation.

At block 714, the assembled substrate/molding tool is disassembled. For example, the molding tool 600 is removed from the substrate exposing the molded encapsulations and protective tape. The release material placed on the molding fixture results in clean removal of the molding tool from the substrate. In one implementation, an automatic disassembly device performs this operation.

At block 716, the protective tape is removed. In one implementation, the protective tape is peeled from the substrate to reveal a clean molded substrate surface free of flash or seams. In one implementation, an automatic tape removal device performs this operation.

At block 718, the molded substrate is allowed to cure. For example, the curing time is determined from the type of molding material used.

Therefore, the method 700 operates to perform flash free overmolding of an LED array substrate. It should be noted that the method 700 is just one implementation and that the operations of the method 700 may be rearranged or otherwise modified within the scope of the various aspects. Thus, other implementations are possible with the scope of the various aspects described.

Figure 8:
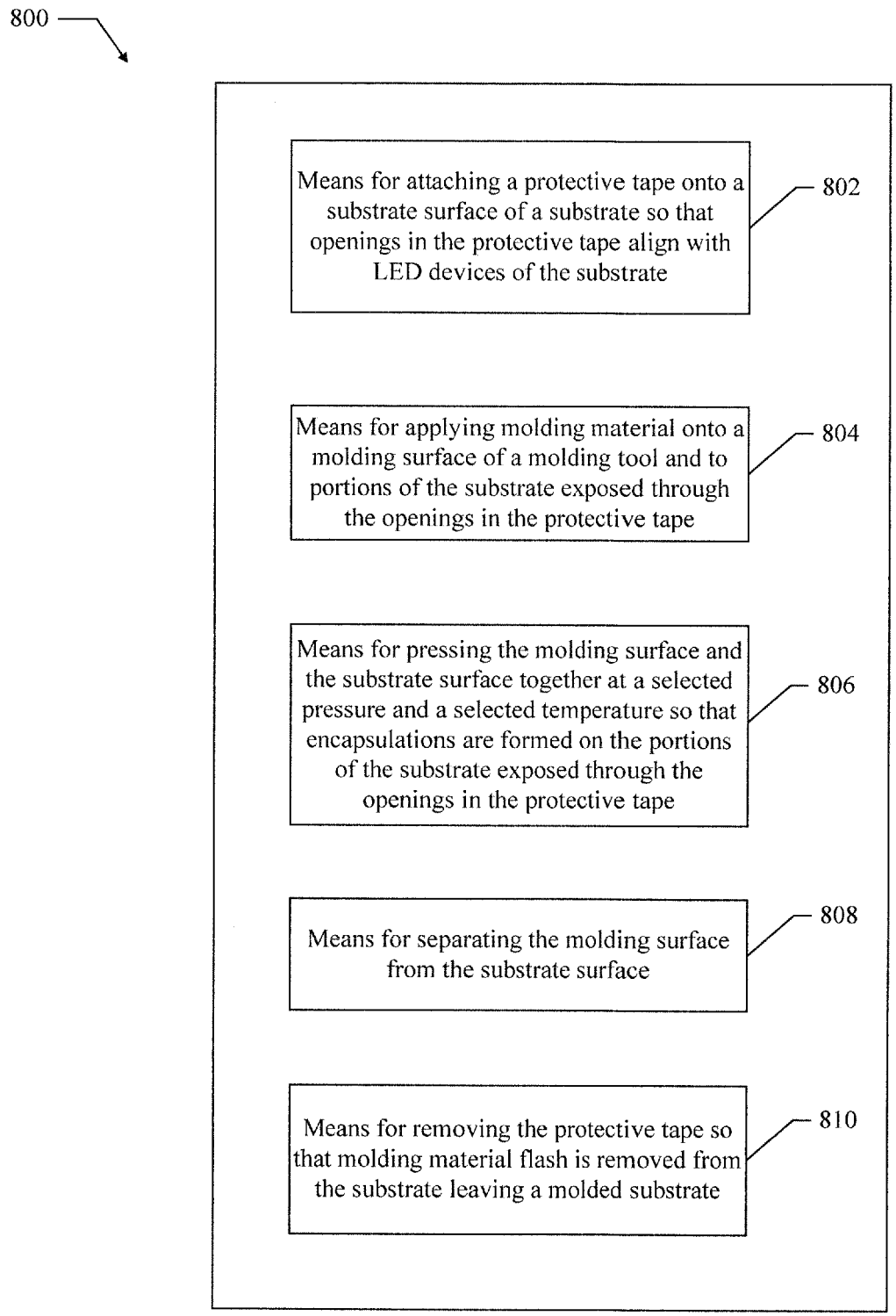
FIG. 8 shows an exemplary apparatus for performing flash free overmolding of an LED array substrate.

FIG. 8 shows an exemplary apparatus 800 for performing flash free overmolding of an LED array substrate. For example, the apparatus 800 is suitable for performing the method 700 shown in FIG. 7. In an aspect, the apparatus 800 is implemented by one or more devices configured to provide aspects of the over molding system as described herein. For example, each device comprises hardware, and/or hardware executing software.

The apparatus 800 comprises a first module comprising means 802 for attaching a protective tape onto a substrate surface of a substrate so that openings in the protective tape align with LED devices of the substrate, which in an aspect is provided by masking tool 400.

The apparatus 800 comprises a second module comprising means 804 for applying molding material onto a molding surface of a molding tool and to portions of the substrate exposed through the openings in the protective tape, which in an aspect is provided by an automated dispenser.

The apparatus 800 comprises a third module comprising means 806 for pressing the molding surface and the substrate surface together at a selected pressure and a selected temperature so that encapsulations are formed on the portions of the substrate exposed through the openings in the protective tape, which in an aspect is provided by a molding press.

The apparatus 800 comprises a fourth module comprising means (808) for separating the molding surface from the substrate surface, which in an aspect is provided by a mold separator.

The apparatus 800 comprises a fifth module comprising means 810 for removing the protective tape so that molding material flash is removed from the substrate leaving a molded substrate, which in an aspect is provided by tape removal device.

The description of the disclosed aspects is provided to enable any person skilled in the art to make or use the present invention. Various modifications to these aspects may be readily apparent to those skilled in the art, and the generic principles defined herein may be applied to other aspects, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of a substrate overmolding system have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for molding encapsulations onto an LED array substrate, the method comprising:
    attaching a protective tape onto a substrate surface of the substrate so that openings in the protective tape align with LED devices of the substrate;
    applying molding material onto a molding surface of a molding tool and to portions of the substrate exposed through the openings in the protective tape;
    pressing the molding surface and the substrate surface together at a selected pressure and a selected temperature so that encapsulations are formed on the portions of the substrate exposed through the openings in the protective tape;
    separating the molding surface from the substrate surface; and
    removing the protective tape so that molding material flash is removed from the substrate leaving a molded substrate.

2. The method of claim 1, wherein said attaching comprises attaching the protective tape so that electrical contacts on the substrate surface are protected from exposure to the molding material.

3. The method of claim 1, further comprising dimensioning a width of the protective tape to be larger than a width of the substrate.

4. The method of claim 1, further comprising applying a release material to the molding surface prior to applying the molding material.

5. The method of claim 1, wherein said applying the molding material comprises applying the molding material to dies and wires exposed through the openings in the protective tape.

6. The method of claim 1, further comprising degassing the molding material on the molding surface and the substrate.

7. The method of claim 1, further comprising curing the molded substrate according to characteristics of the molding material.

8. The method of claim 1, further comprising performing said attaching in a continuous process wherein a selected length of the protective tape is segmented into a plurality of protective tape portions that are attached to a plurality of LED array substrates, respectively.

9. The method of claim 1, wherein the LED array substrate is configured to have at least one of a rigid portion and a flexible portion.

10. The method of claim 1, wherein the substrate comprises at least one of a perforation, groove and gap to facilitate separation of the LED devices from the substrate, and said attaching comprises attaching the protective tape so that the at least one of the perforation, groove and gap are protected from exposure to the molding material.

11. The method of claim 1, wherein the molding material comprises at least one of silicone and phosphor.

12. The method of claim 1, wherein the protective tape comprises at least one of polyimide based tape and Teflon™ based tape.

13. An apparatus for molding encapsulations onto an LED array substrate, the apparatus comprising:
    means for attaching a protective tape onto a substrate surface of the substrate so that openings in the protective tape align with LED devices of the substrate;
    means for applying molding material onto a molding surface of a molding tool and to portions of the substrate exposed through the opening in the protective tape;
    means for pressing the molding surface and the substrate surface together at a selected pressure and a selected temperature so that encapsulations are formed on the portions of the substrate exposed through the openings in the protective tape;
    means for separating the molding surface from the substrate surface; and
    means for removing the protective tape so that molding material flash is removed from the substrate leaving a molded substrate.

14. The apparatus of claim 13, wherein said means for attaching comprises means for attaching the protective tape so that electrical contacts on the substrate surface are protected from exposure to the molding material.

15. The apparatus of claim 13, wherein said means for applying the molding material comprises means for applying the molding material to dies and wires exposed through the openings in the protective tape.

16. The apparatus of claim 13, wherein said means for attaching comprises means for attaching the protective tape in a continuous process wherein a selected length of the protective tape is segmented into a plurality of protective tape portions that are attached to a plurality of LED array substrates, respectively.

17. The apparatus of claim 13, wherein the LED array substrate is configured to have at least one of a rigid portion and a flexible portion.

18. The apparatus of claim 13, wherein the substrate comprises at least one of a perforation, groove and gap to facilitate separation of the LED devices from the substrate, and said means for attaching comprises means for attaching the protective tape so that the at least one of the perforation, groove and gap are protected from exposure to the molding material.

19. The apparatus of claim 13, wherein the molding material comprises at least one of silicone and phosphor.

20. An apparatus for molding encapsulations onto an LED array substrate, the apparatus comprising:
    a masking tool configured to attach a protective tape onto a substrate surface of the substrate so that openings in the protective tape align with LED devices of the substrate;
    a dispenser configure to apply molding material onto a molding surface of a molding tool and to portions of the substrate exposed through the openings in the protective tape;
    a molding press configured to press the molding surface and the substrate surface together at a selected pressure and a selected temperature so that encapsulations are formed on the portions of the substrate exposed through the openings in the protective tape;
    a mold separator configured to separate the molding surface from the substrate surface; and a removal device configured to remove the protective tape so that molding material flash is removed from the substrate leaving a molded substrate.

21. The apparatus of claim 20, wherein said masking tool is configured to attach the protective tape so that electrical contacts on the substrate surface are protected from exposure to the molding material.

22. The apparatus of claim 20, wherein said dispenser is configured to apply the molding material to dies and wires exposed through the openings in the protective tape.

23. The apparatus of claim 20, further comprising a vacuum oven to degas the molding material on the molding tool and the substrate.

24. The apparatus of claim 20, wherein said masking tool is configured to attach the protective tape in a continuous process wherein a selected length of the protective tape is segmented into a plurality of protective tape portions that are attached to a plurality of LED array substrates, respectively.

25. The apparatus of claim 20, wherein the LED array substrate is configured to have at least one of a rigid portion and a flexible portion.

26. The apparatus of claim 20, wherein the substrate comprises at least one of a perforation, groove and gap to facilitate separation of the LED devices from the substrate, and said attaching comprises attaching the protective tape so that the at least one of the perforation, groove and gap are protected from exposure to the molding material.

27. The apparatus of claim 20, wherein the molding material comprises at least one of silicone and phosphor.

28. The apparatus of claim 20, wherein the protective tape comprises at least one of polyimide based tape and Teflon™ based tape.

* * * * *